(12) United States Patent
Gung

(10) Patent No.: US 6,491,801 B1
(45) Date of Patent: *Dec. 10, 2002

(54) AUXILIARY VERTICAL MAGNET OUTSIDE A NESTED UNBALANCED MAGNETRON

(75) Inventor: Tza-Jing Gung, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/924,251

(22) Filed: Aug. 7, 2001

(51) Int. Cl.⁷ .............................................. C23C 14/35
(52) U.S. Cl. ................................ 204/298.2; 204/298.19
(58) Field of Search ........................ 204/298.19, 298.2

(56) References Cited

U.S. PATENT DOCUMENTS 6,183,614 B1   2/2001   Fu ........................... 204/298.2

FOREIGN PATENT DOCUMENTS

JP     9-41135      10/1997
JP    10-152774     9/1998

*Primary Examiner*—Rodney G. McDonald
(74) *Attorney, Agent, or Firm*—Charles S. Guenzer, Esq.

(57) ABSTRACT

An unbalanced magnetron rotatable about the back of a sputtering target and including a nested magnetron part having an outer magnetic pole of a first magnetic polarity surrounding an inner magnetic pole of an opposed second magnetic polarity and an auxiliary magnet increasing the unbalance and adjusting the uniformity of sputtering. In a first embodiment, the auxiliary magnet is vertically magnetized and placed on an opposite side of the rotation axis from the major portion of the nested magnetron part. This embodiment most strongly affects the vertical magnetic field distribution near the wafer and can produce a more uniform magnetic field at the wafer. In a second embodiment, the auxiliary magnet is horizontally magnetized and placed between the inner pole and the portion of the outer pole near the target periphery. This embodiment most strongly affects the sputtering erosion pattern near the target periphery. The two embodiments can be combined.

16 Claims, 8 Drawing Sheets

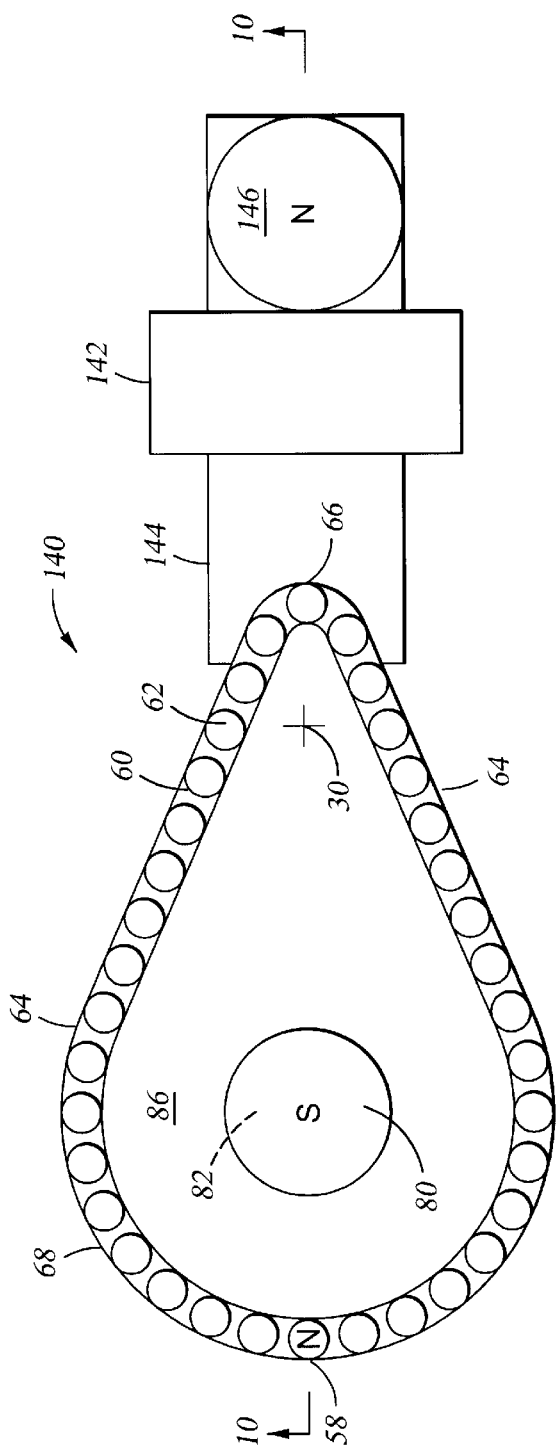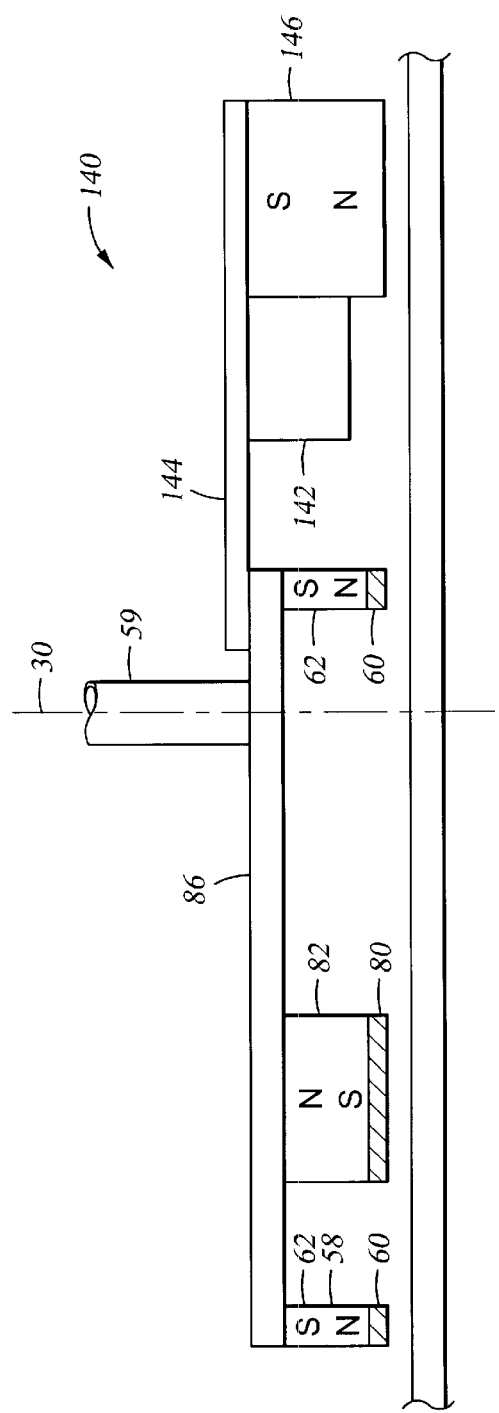
Fig. 9
Fig. 10

AUXILIARY VERTICAL MAGNET OUTSIDE A NESTED UNBALANCED MAGNETRON

RELATED APPLICATION

This invention is related to patent application Ser. No. 09/924,255 concurrently filed on Aug. 7, 2000.

BACKGROUND OF THE INVENTION

1. Field of the Invention

The invention relates generally to sputtering of materials. In particular, the invention relates to a magnetron creating a magnetic field to enhance sputtering.

2. Background Art

Sputtering, alternatively called physical vapor deposition (PVD), is the most prevalent method of depositing layers of metals and related materials in the fabrication of semiconductor integrated circuits. The semiconductor industry typically uses DC magnetron sputtering in which a wafer to be sputter deposited is placed in opposition to a metal target across a plasma reactor chamber filled with an argon working gas. The target is biased sufficiently negatively with respect to the chamber that the argon is excited into a plasma. The positively charged argon ions are strongly accelerated toward the negatively biased target and sputter metal atoms from it. The metal atoms dislodged from the target fall at least in part on the wafer and are deposited in a layer thereon.

In metal sputtering, the target or at least its inner surface has substantially the same metallic composition as that desired for the sputter deposited layer, for example, aluminum, copper, titanium, tantalum, tungsten, etc. In reactive sputtering, a chemically reactive gas such as nitrogen is additionally supplied into the chamber and the reactive gas reacts with sputtered metal atoms at the wafer surface to deposit a metal compound on the wafer, such as the refractory metal nitrides TiN, TaN, WN. The refractory nitrides are particularly useful as barrier layers between a dielectric and a later sputtered metal layer, and a layer of the associated refractory metal is sputtered first onto the dielectric to serve as a glue layer promoting adhesion of the metal to the dielectric. Accordingly, it is often advantageous to use the same sputter reactor to deposit a bilayer liner of, for example, Ti/TiN, Ta/TaN, or W/WN. Sputtering is also used to coat the sides of a via hole with a thin copper seed layer that nucleates and provides an electrode for subsequent filling of copper into the hole by electrochemical plating (ECP).

However, for advanced integrated circuits, sputtering suffers from the problem that sputter deposition, as described above, involves a fundamentally ballistic process of transporting sputtered atoms from the target to the wafer. In the process, the sputtered atoms are emitted in a broad pattern about the normal to the target. Such a distribution is ill suited to filling narrow holes, such as via holes extending through an inter-level dielectric layer separating two layers of metallization. Such via holes in advanced devices may have aspect ratios of 3:1 and greater. A broad sputtering pattern causes the top of the high aspect-ratio hole to close before the bottom is filled. As a result, voids form in the sputtered via metallization. Similarly, the sputtered liner layers tend to be much thicker at the top of the via hole than at the bottom.

One method of adapting sputtering to deep hole filling, as well as to other applications, is self-ionized plasma (SIP) sputtering, as disclosed by Fu in U.S. Pat. No. 6,183,614, by Chiang et al. in U.S. patent application, Ser. No. 09/546,798, filed Oct. 8, 1999 and now issued as U.S. Pat. No. 6,306,265, and by Fu et al. in U.S. patent application, Ser. No. 09/564,798, pending filed Apr. 11, 2000, all three incorporated herein by reference in their entireties. SIP sputtering allows a significant fraction of the sputtered atoms to be ionized using a somewhat conventional sputtering reactor. The charged sputtered metal ions can be electrically attracted into narrow via holes in the wafer. Furthermore, the sputtered metal ions can in part be attracted back to the target to further sputter the target, thereby allowing the pressure of the argon working gas to be significantly decreased. In the case of copper, it is possible to eliminate the need for the argon working gas after the plasma has been ignited in a process called sustained self-sputtering (SSS).

Most SIP magnetrons include an outer pole of a first magnetic polarity arranged in a closed band surrounding an inner pole of an opposed, second magnetic polarity. Further, the total magnetic flux integrated over the area of the outer pole, also called the total magnetic intensity, is significantly larger than that of the inner pole, preferably by a factor of at least 1.5. The resultant unbalanced magnetron produces a magnetic field component projecting from the outer pole towards the wafer before that component bends back to close on the back of the outer pole. Such a projecting magnetic field has several advantages. It extends the plasma farther away from the target; it guides ionized sputtered particles towards the wafer; and, it reduces plasma electron leakage to the chamber walls.

An SIP magnetron should be relatively small in order to increase the effective plasma power density, which for a fixed target power increases inversely with the area of the magnetron. A prevalent design for a SIP magnetron includes an outer pole having a generally triangular shape with the triangular base of the outer pole positioned near the periphery and the triangular apex located near the central axis of the chamber about which the magnetron is rotated to provide angularly uniform sputtering of the target.

Such a simply shaped magnetron is relatively constrained in the ease of optimizing its design for the various requirements of a magnetron intended for commercial usage, such as sputtering uniformity, high sputtering rate, projection of the magnetic field, and low operating pressure. A further problem is that sputtered material tends to redeposit at the periphery of the target where the magnetic field tends to be less. The redeposited material is not effectively resputtered and has a crystallography different than the original target. As a result, the redeposited material grows in thickness and tends to flake off, thereby producing deleterious particles which significantly reduce chip yield.

One technique for increasing the peripheral magnetic field and hence preventing redeposition from accumulating includes moving the inner pole closer to the outer pole near the target periphery. However, this change pushes the high-density plasma closer to the grounded or floating shield near the target edge. The proximity of the plasma to such an electrically biased shield has been observed to cause problems with the stability of the plasma as the magnetron sweeps the plasma around the target periphery. Arcing to the shields may occur, which also produces particles. The plasma may shrink away from the shields or even collapse in some situations, obviously severely impacting deposition uniformity and yield. SIP sputtering typically relies upon high target powers, usually identified by high target voltage, for example, around −500 to −800 VDC and requiring powers of 30 kW or more. For reasons of economy, the size of the power supply is selected to operate near its limit. With the plasma positioned close to the shields, plasma fluctuations have been observed which temporarily raise the target voltage to −1000 VDC, sufficient to burn out the typically used power supplies.

Accordingly, it is desired to provide an unbalanced magnetron having additional design freedom. It is also desired to increase the sputtering rate near the target periphery without bringing the principal magnetic field too close to the periphery. It is further desired to improve the uniformity of sputter deposition.

A further problem arises from the desire to reduce the argon pressure so that the plasma is barely supported and is operating in conditions close to extinguishment. Such a plasma is unstable. Even if it does not extinguish, it may change in intensity and distribution, effects which degrade the desired uniformity of sputter deposition.

SUMMARY OF THE INVENTION

An unbalanced magnetron useful for DC sputtering having a nested magnetron and an auxiliary magnet. The magnetron is rotated about a center of the target being sputtered.

In one aspect of the invention, the auxiliary magnet is a horizontally magnetized planar magnet placed between the inner and outer poles on the side of the inner pole closer to the target periphery. The poles of the planar magnet may be chosen to reinforce the pole of the inner and outer magnetic poles closer to the target. Such a planar auxiliary magnet increases the sputtering rate near the outer target periphery.

In another aspect of the invention, the auxiliary magnet is a vertically magnetized magnet placed on an opposite side of the rotation axis from the major portion of the nested magnetron. Preferably, the polarity of the auxiliary magnet corresponds to the polarity of the outer magnetic pole. Such a vertical auxiliary magnet increases the vertical magnetic field adjacent the wafer.

The two aspects may be combined in a single magnetron.

The nested magnetron has an inner pole of one magnetic polarity surrounded by an outer pole of another polarity and including an auxiliary magnet and is preferably an unbalanced magnetron in which the total magnetic flux of the outer pole is significantly greater than that of the inner pole, for example, in a ratio of at least 1.5. The nested magnetron may have a generally triangular outer shape with the axis of rotation near the apex of the triangle and the base of the triangle near the target periphery.

The auxiliary magnet may be used to optimize various portions of the magnetic field distribution. One effect of the auxiliary magnet may be to increase the unbalance of the magnetic field distribution.

BRIEF DESCRIPTION OF THE DRAWINGS

FIG. 9 is a bottom plan view of another magnetron of the invention using an externally vertically magnetized magnet.

FIG. 10 is a cross-sectional view of the magnetron of FIG. 9 taken along view line 10—10.

DETAILED DESCRIPTION OF THE PREFERRED EMBODIMENTS

Figure 1:
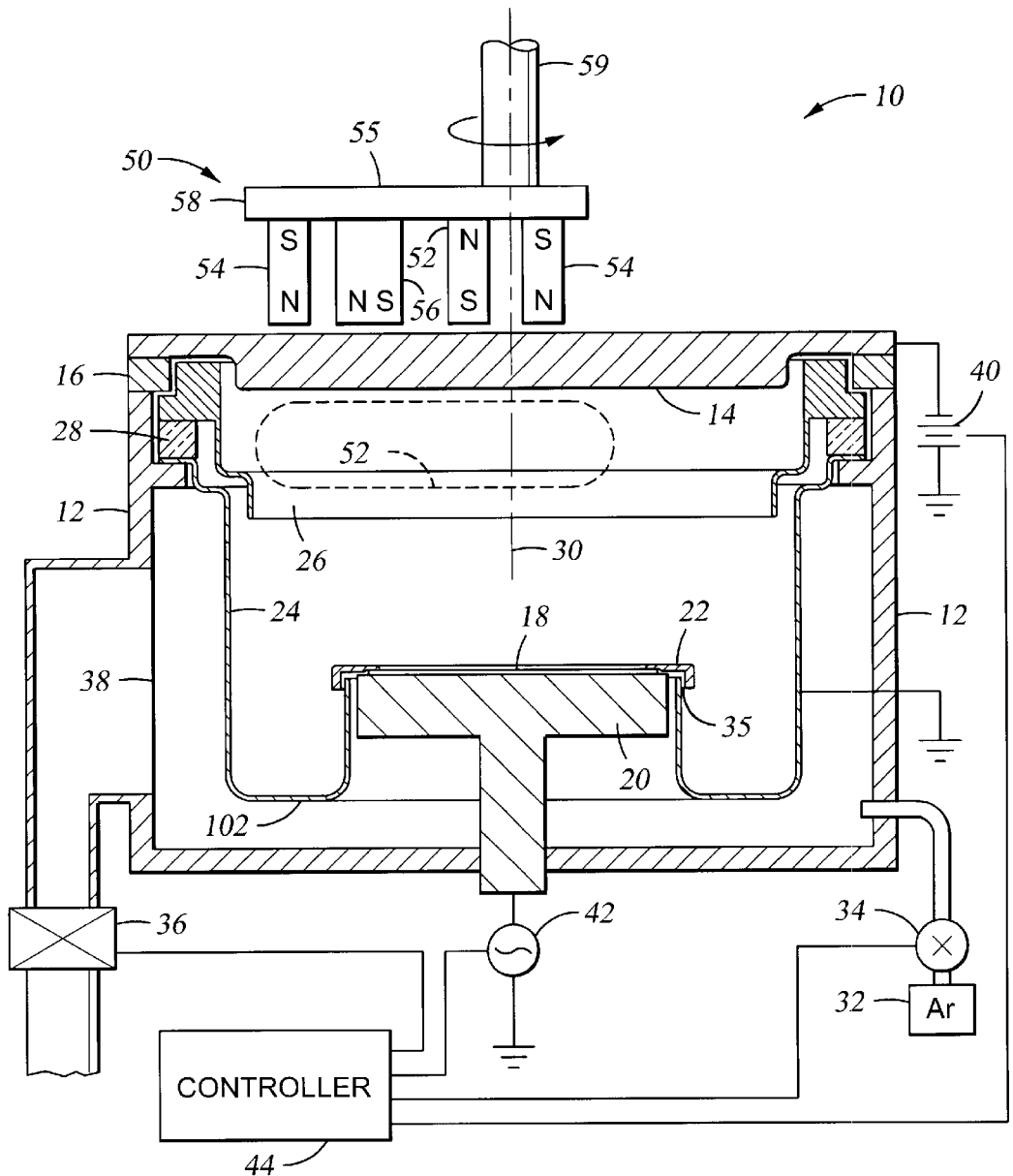
FIG. 1 is a cross-sectional view of a self-ionized plasma (SIP) sputter reactor.
Figure 2:
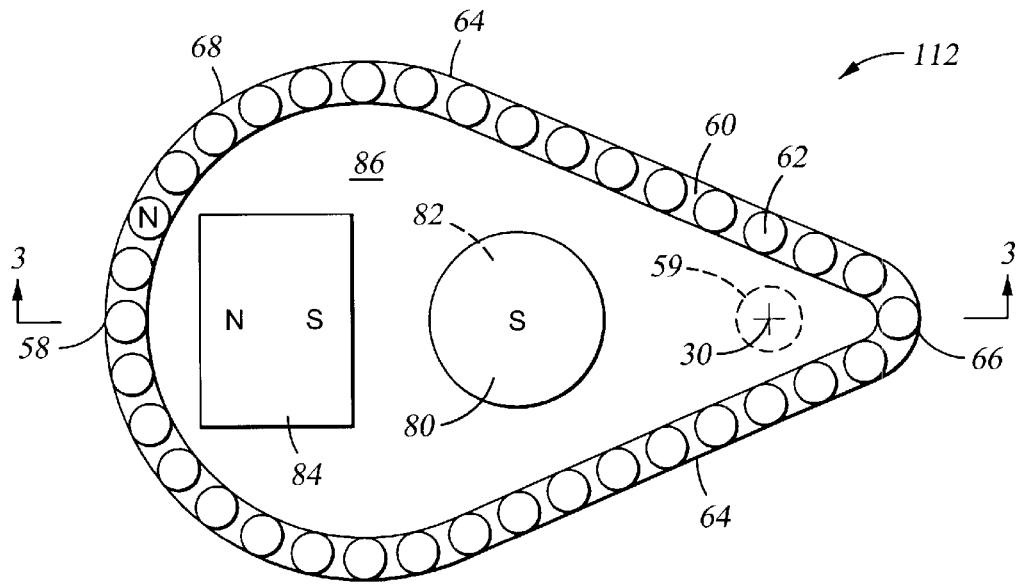
FIG. 2 is a bottom plan view of a magnetron of the invention usable with the SIP sputter reactor of FIG. 1.
Figure 3:
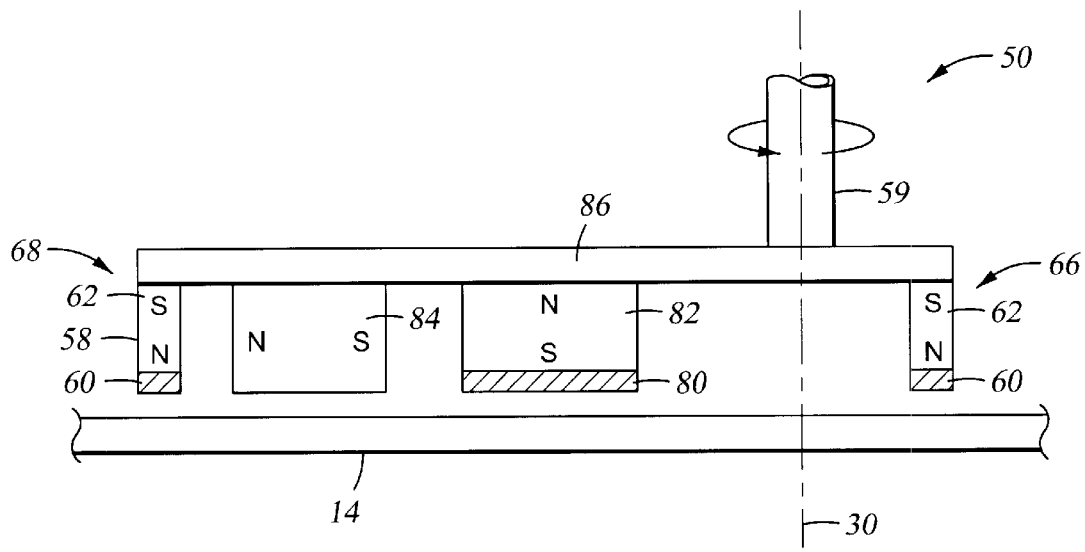
FIG. 3 is a cross-sectional view of the magnetron of FIG. 2 taken along view line 3—3.

On embodiment of the invention, illustrated in the cross-sectional view of FIG. 1 includes a self-ionized plasma (SIP) sputter reactor 10 and an inventively configured magnetron 50, which is illustrated in more detail in the schematic bottom plan view of FIG. 2 and the side cross-sectional view of FIG. 3.

Concentrating first on the chamber parts of FIG. 1, the reactor 10 includes a chamber wall 12 supporting a biased metal target 14 through a dielectric isolator 16, thereby forming a sealed vacuum chamber. A wafer 18 is held on a pedestal electrode 20 by, for example, a clamping ring 22 although an electrostatic chuck may alternatively be used. The chamber walls 12 are protected from sputter deposition by an electrically grounded shield 24, which also acts as an anode to the target cathode. An electrically floating shield 26 supported on a second dielectric isolator 28 is arranged about a central chamber axis 30 between the grounded shield 24 and the target 14. A negative charge from plasma electrons inherently accumulates on the floating shield 26 during sputtering and repels deposition of further plasma electrons, thereby reducing electron leakage and extending the plasma closer to the wafer 18.

Argon working gas is supplied into the chamber 12 from a gas supply 32 and is metered by a mass flow controller 34. The working gas flows into the processing region through a gap 35 between the pedestal 20, the grounded shield 24, and the wafer clamp 22. A vacuum pumping system 36 connected to a pumping port 38 maintains the interior of the chamber 12 at a low but controllable pressure. A negative DC power supply 40 biases the target 14 to about −500 to −600 VDC, which after plasma ignition is sufficient to maintain the argon working gas as a plasma. Ignition is usually accomplished at a higher voltage and higher chamber pressure. The negative bias attracts to the target 14 positively charged ions, whether of argon or of the metal in SIP sputtering, where they sputter target atoms, which are thereafter deposited on the wafer 18 to form a layer of sputtered material. An RF power supply 42 applies RF power to the pedestal electrode 20, which causes it to develop a negative DC self-bias in the presence of a plasma. A computerized controller 44 controls the power supplies 40, 42, the mass flow controller 34, and the pumping system 36, thereby controlling the sputtering conditions.

The magnetron 50 is located in back of the target 14 to generate a magnetic field adjacent to the front (bottom) of the target 14. The magnetic field traps electrons, which raises the plasma density in a high-density plasma region 52, thereby increasing the sputtering rate. An argon chamber pressure of about 6 to 10 milliTorr is typically required to ignite the plasma. However, if the density of metal ions in the high-density plasma region 52 is sufficiently high, the supply of argon can be reduced and sometimes eliminated so that a significant portion if not all of the target sputtering is effected by metal ions in the SIP process. Under the proper conditions, chamber pressure for SIP sputtering can be reduced to well below 1 milliTorr. The very low sputtering pressures are advantageous in reducing scattering of the sputtered atoms as they move towards the wafer and in reducing the temperature of the wafer since energetic argon ions are no longer bombarding it.

SIP sputtering is promoted by high target power and a small-area intense magnetic field produced by the magnetron 50, as well as designing the magnetron to minimize plasma leakage to the shields and target. Such a magnetron 50 includes an inner magnet pole 52 of one vertical magnetic polarity surrounded by an outer magnet pole 54 of the opposed vertical magnetic polarity in a nested configuration. One or both of the inner and outer magnet poles magnet poles 52, 54 may be composed of multiple magnets with perhaps a pole face linking the magnets within the pole. The magnetic polarities of the magnet poles 52, 54 illustrated in FIG. 2 are the polarities at one end of the magnets with the other ends having the opposite polarity. The inner and outer magnet poles 52, 54 are magnetically coupled by a magnetic yoke 55 on their ends away from the target 30.

Additionally, according to one aspect of the invention, the magnetron 50 includes a horizontally magnetized planar magnet 56 arranged between the inner and outer magnet poles 52, 54 on the side of the inner pole 52 away from the central axis and towards the outer periphery 58 of the rotating magnetron 50. Preferably, the radially (with respect to the rotation axis 30) outer horizontal magnetic polarity of the planar magnet 56 matches the vertically downward magnetic polarity of the outer magnet pole 54, and its radially inner horizontal magnetic polarity matches the vertically downward magnetic polarity of the inner magnet pole 52.

The inner and outer magnetic poles 52, 54 are magnetically sized to produce an unbalanced magnetron in which the total magnetic flux or intensity, that is, flux density integrated over the surface of the pole face produced by the outer pole 54 is significantly larger than the total magnetic flux produced by the inner pole 52, for example, by a factor of at least 1.5. The integrated magnetic flux may be referred to as the total magnetic intensity. Because the planar magnet 56 has poles assisting the inner magnetic pole 52 and the more closely adjacent portion of the outer pole 54, the planar magnet 56 contributes to a yet more strongly unbalanced magnetron though with different characteristics in part than a nested unbalanced magnetron with only a single pair of nested poles.

The magnetron 50 has a relatively small area and is substantially disposed on one side of the central chamber axis 30. An unillustrated motor drives a motor shaft 59 extending along the central axis 30 and supporting the magnetron 50 through the magnetic yoke 55. Thereby, the magnetron is swept around the target 14 to produce a circularly symmetric erosion pattern.

The magnetron 50 is illustrated in more detail in the bottom plan view of FIG. 2 and the cross-sectional view of FIG. 3 taken along view line 3—3 of FIG. 2. The outer pole of a first magnetic polarity is defined by an outer pole face 60 arranged in a closed band underlying a plurality of cylindrical magnets 62 of one vertical magnetic polarity, for example, N, extending along the central axis 30. Both the pole face 60 and the cylindrical magnets 62 are arranged in a smoothly truncated triangular shape having two straight side portions 64 of preferably equal length inclined to each other and joined at their apex ends by a small arced portion 66 and at their base ends by a large arced portion 68, defining at its center the outer periphery 58 of the rotating magnetron 50. The large arced portion 68 extends over slightly more than 180° and is circularly symmetric about an arc center falling on the axis of symmetry of the magnetron shaped generally like an isosceles triangle. The small arced portion 66 is also circularly symmetric, but with a smaller radius. The apex angle of the triangular shape, as illustrated, is 48°. Other values of the apex angle may be chosen, for example, in the range of 35° to 60°. The width of the band of the outer pole face 60 is approximately equal to the diameters of the cylindrical magnets 62 and includes a large aperture within the closed band.

The inner pole of an opposed second magnetic polarity is defined by a circular inner pole face 80 and a large, inner cylindrical magnet 82 of a vertical magnetic polarity opposite that of the smaller, outer cylindrical magnets 62, for example S. The center of the inner cylindrical magnet 82 is displaced away from the arc center of the large arc portion 68 of the outer pole face 68 in a direction towards its inner apex 66. Other magnet arrangements may be used for both the inner and outer poles.

The inner and outer magnets 82, 62 are supported on and magnetically coupled by a magnetic yoke 86 supported on the rotation shaft 59. The magnetic yoke and the pole faces 60, 80 are formed, for example, of a soft, magnetic material, such as SS410 stainless steel.

A rectangularly shaped planar bar magnet 84 is placed between the inner cylindrical magnet 82 and the outer cylindrical magnets 62 near the magnetron's outer periphery 58. It is horizontally magnetized with the magnetic pole, N as illustrated, near the magnetron outer periphery 58 matching that of the target-side pole of the outer cylindrical magnets 62, and the other pole matching the target-side pole of the adjacent inner magnet 80. The planar magnet 84 and its magnetization direction extend generally along the radial axis of symmetry of the magnetron 50. The planar magnet 84 includes no bottom magnetic pole face, which would tend to magnetically short it. As a result, the bottom face of the planar magnet 84 is preferably aligned with the bottom faces of the poles pieces 60, 80 relatively close to the back of the target 14. On the other hand, it has been observed that the planar magnet 84 may be directly attached to the magnetic yoke 86 without degrading its performance. Nonetheless, it is preferred that a non-magnetic spacer of thickness of about 2 mm be used between the planar magnet 84 and the magnetic yoke 86.

All the magnets 62, 82, 84 are preferably permanent magnets. The magnet configuration may be more complex than that described above, for example, including multiple inner magnets 82 and having outer magnets 62 of different intensities.

Figure 4:
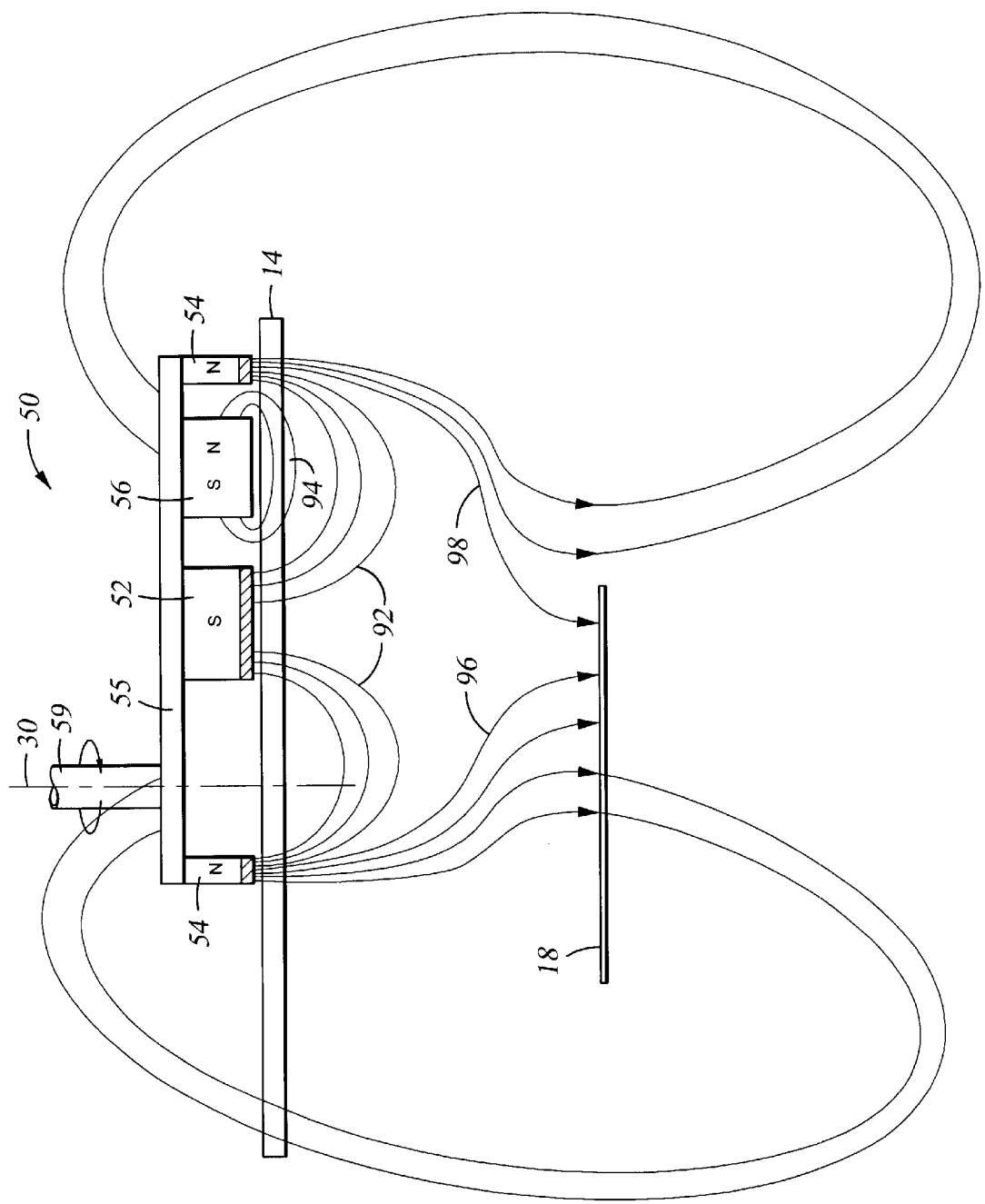
FIG. 4 is a cross-sectional view of the magnetic field distribution produced by the magnetron of FIGS. 2 and 3.

The magnetic field distribution for such a magnetron configuration is illustrated in the cross-sectional view of FIG. 4. It includes a generally semi-toroidal field 92 typical of many SIP magnetrons. It additionally includes a horizontal component 94 extending generally parallel beneath the planar magnet 56 and generally reinforcing the semi-toroidal field 92 in the outer region of the target 14, thereby increasing the plasma density and hence sputtering rate in that region. Small magnetrons typically used in the past for SIP sputtering generally suffer from low sputtering rates in the outer region of the target. The planar magnet 56 relieves this problem by increasing the horizontal magnetic field adjacent the outer region of the target. The magnetic field also includes downwardly projecting portions 96, 98 extending downwardly along the chamber walls and inwardly towards the wafer. These downwardly projecting portions 96, 98 extend the plasma, prevent plasma leakage to the chamber walls, and guide ionized sputter atoms towards the wafer 18. The projecting portions 96, 98 close generally near the side or rear of the magnetron 50.

These calculations support the belief that the erosion characteristics and plasma density are controlled by the near-field components of the magnetic field distribution near the target 14 while uniformity is controlled by the far-field components away from the target 14 and towards the wafer 18. Although the auxiliary planar magnet 56 increases the unbalance of the magnetron, thereby causing the magnetic field to more strongly project to the wafer 18, the principal effect of the planar magnet 56 is to intensify the horizontal magnetic field close to the target 14, thus increasing the plasma density and the sputtering rate in the outer peripheral areas of the target 14

In a comparative example, an unbalanced magnetron without an auxiliary planar magnet was used in an SIP reactor to sputter TiN or TaN. This combination produces reasonably good uniformity of 4%, but a 3 mm redeposition zone develops at the edge of the wafer. In contrast, when the planar horizontally magnetized auxiliary magnet of FIGS. 1–3 is used in an inventive example, edge redeposition is eliminated with no degradation in the uniformity.

Figure 5:
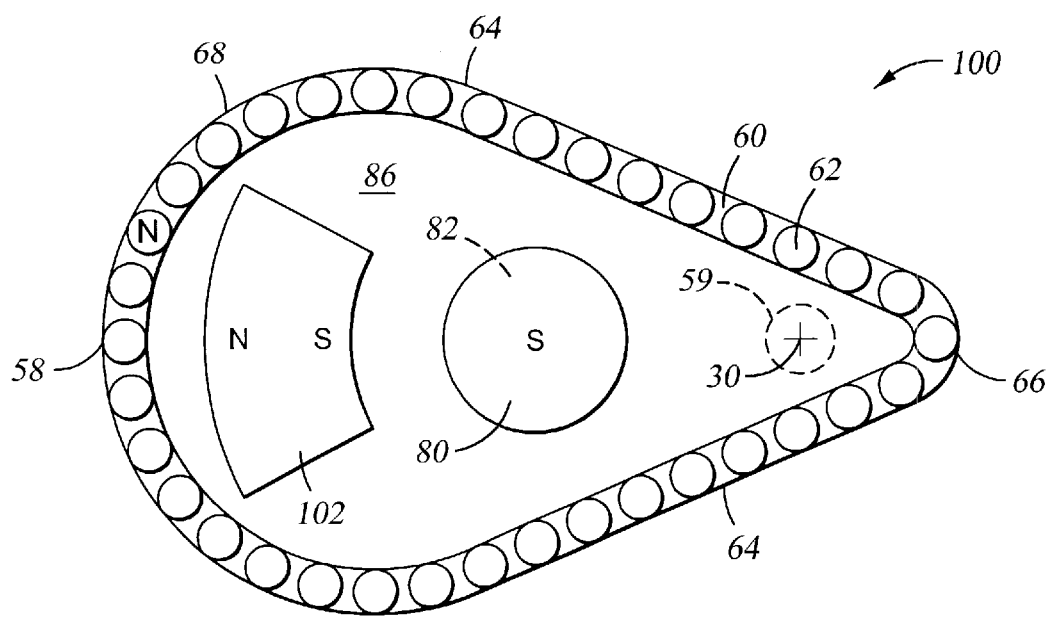
FIG. 5 is a bottom plan view of a first variant of the magnetron of FIGS. 2 and 3.

A related embodiment of the invention, which improves the effect of the planar magnet, includes a magnetron 100 including an arc-shaped planar magnet 102, as illustrated in the bottom plan view of FIG. 5, instead of the rectangular planar magnet 84. The curvatures of inward arced face should be based on the curvature of the inner pole face 80 so as to produce a nearly uniform gap. The arc-shaped planar magnet 100 is horizontally magnetized either parallel to the symmetry axis of the illustrated magnetron 100 or, with more difficulty, with a varying magnetization direction having an angle varying to be more closely perpendicular to the tangent of the arc of the planar magnet 102.

Figure 6:
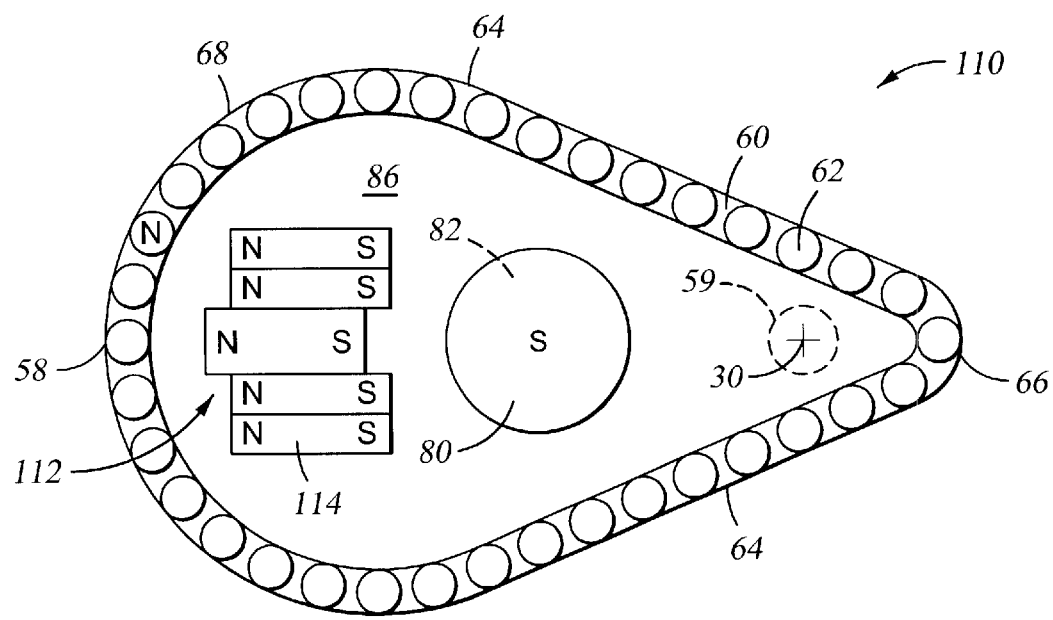
FIG. 6 is a bottom plan view of a second variant of the magnetron of FIGS. 2 and 3.

Yet another related embodiment of a magnetron 1 10, illustrated in the bottom plan view of FIG. 6, allows further optimization with reduced fabrication difficulty and expense by using an arc-shaped array 112 of rectangular plate magnets 114. In one sub-embodiment, the plate magnets 114 have equal lengths to closely resemble the arc-shaped planar magnet 100 of FIG. 5. The arc-shaped array 112 may be made to differ primarily from the arc-shaped planar magnet 100 by the presence of jagged edges. In a second sub-embodiment, the plate magnets 114 have varying lengths, preferably with the longer ones towards the central axis of the arc-shaped array 112. The variation of the lengths allows fine tuning of the magnetic field distribution and further optimization of the sputtering uniformity.

Figure 7:
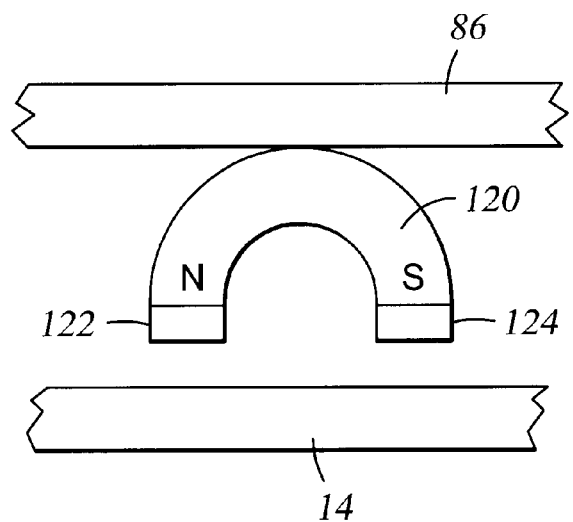
FIG. 7 is a cross-sectional view of a first alternative to the horizontally magnetized planar magnet using one of more horse shoe magnets.
Figure 8:
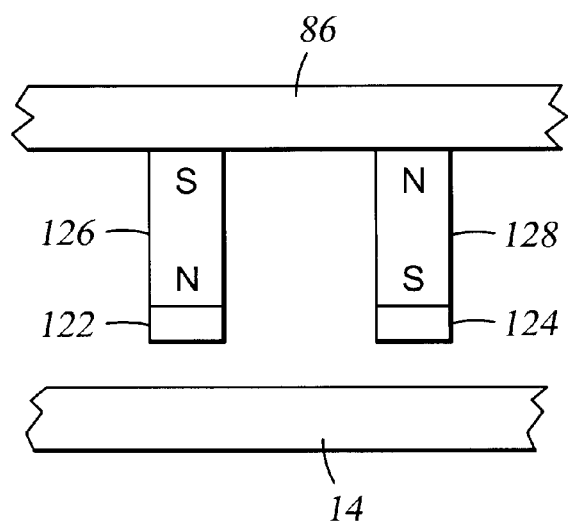
FIG. 8 is a cross-sectional view of a second alternative using pairs of magnets with vertically opposed magnetization.

Similar results may be obtained when the horizontally magnetized planar magnet is replaced, as illustrated in the cross-sectional view of FIG. 7, by one or more horse shoe magnets 120 fixed to the magnetic yoke 86 and which may have pole faces 122, 124 magnetically linking multiple horse shoe magnets 120. Alternatively, as illustrated in the cross-sectional view of FIG. 8, the planar magnet may be replaced by oppositely polarized magnet assemblies 126, 128 fixed to the magnetic yoke 86 and having their respective two pole faces 122, 124. The magnet assemblies 126, 128 may be vertically extending magnet plates or magnet arc segments and may be composed of multiple rod or plate magnets of the indicated magnetic polarity. However, these vertically magnetized configurations produce a magnetic field which projects somewhat further to the bottom of the target than does a horizontally magnetized planar magnet. One of the major advantages of a horizontally magnetized planar magnet is the strong horizontal magnetic field produced close to the bottom face of the target 14.

A second aspect of the invention includes a magnetron 140 illustrated in the bottom plan view of FIG. 9 and in cross-sectional view of FIG. 10 taken along view line 10—10 of FIG. 9. This magnetron includes the previously described nested magnetron part having an outer pole of a first vertical magnetic polarity made up of an outer pole face 60 and outer magnets 62 and an inner pole of the other vertical magnetic polarity made up of an inner pole face 80 and inner magnet 82. The center of the cylindrical inner pole is close to the arc center of the large arced portion 68. The nested magnetron part is mechanically counterbalanced about the rotation axis 30 by a counterbalance weight 142 hung on a counterbalance arm 144 fixed to the magnetic yoke 86. In this embodiment, an auxiliary vertically magnetized magnet 146 of the first vertical magnetic polarity (that is, the same polarity as the outer pole) is supported on the counterbalance arm 144, preferably near its distal end on an opposite side of the rotation axis 30 from the nested magnetron part, in particular, the inner pole of the nested magnetron part. Preferably, the counterbalance arm 144 is non-magnetic so that is does not magnetically couple the auxiliary magnet 146 to the other magnets 62, 82, but a magnetic counterbalance arm may be used taking into account how it affects the magnetic field.

Figure 11:
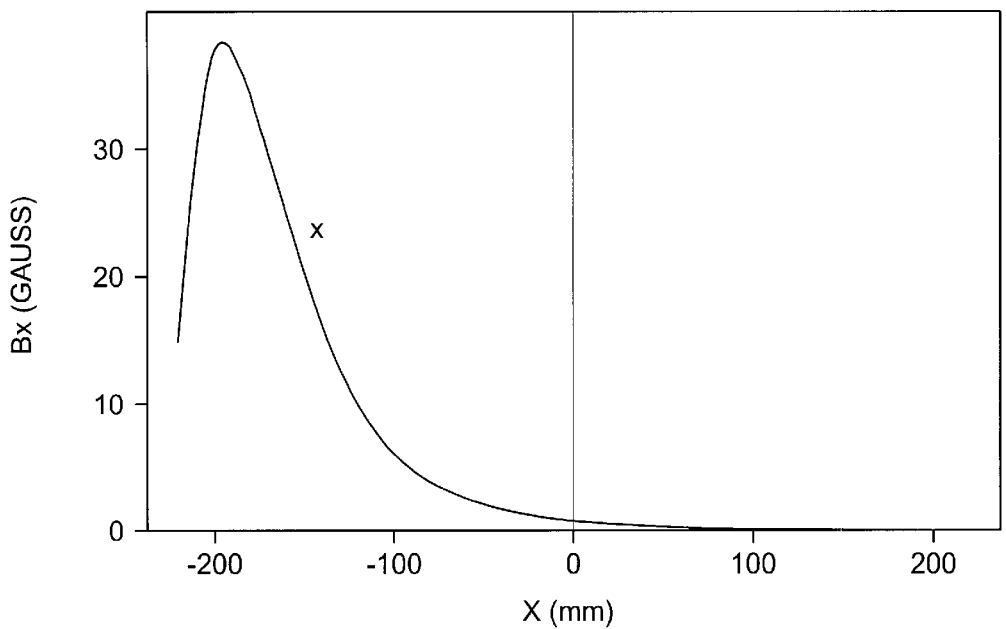
FIGS. 11 and 12 are graphs of the magnetic field near the target produced by the external vertically magnetized auxiliary magnet.
Figure 12:
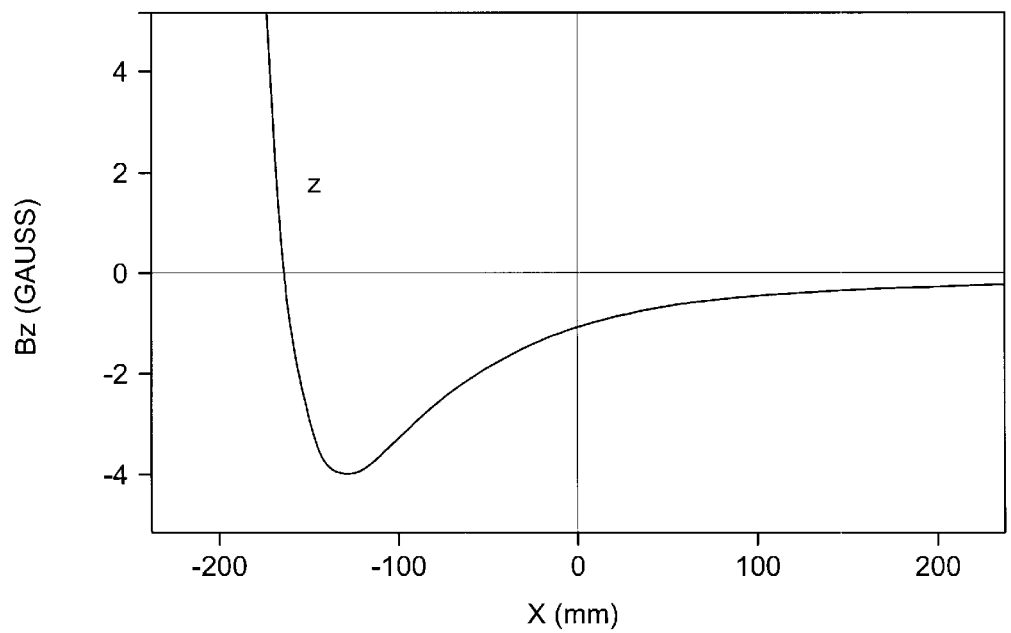

Referring back to FIG. 4, the effect of the unillustrated vertically magnetized auxiliary magnet 146 is to supplement and intensify the vertically projecting magnetic field lines 96 incident on the wafer 18 and to further spread them to the illustrated left side of the wafer 18. This effect is supported by calculations of the magnetic field produced by the vertically magnetic auxiliary magnet. The x-component $B_x$ of the magnetic field is plotted in FIG. 11, and the y-component, By in FIG. 12, both at vertical positions just below the target. The left sides of the plots correspond to the area of the auxiliary magnet 146, the rights sides to the nest magnetron part. These fields have been designed for a 300 mm-diameter wafer with the center axis at x=0. It is seen that the vertically magnetized auxiliary magnet has little influence on the illustrated right side corresponding to the area of the nested magnetron part. Therefore, the external vertically magnetized auxiliary magnet has very little effect on the sputtering process as it affects the target, which for reasonably sized magnets is dominated by the nested magnetron part.

However, the auxiliary magnet produces a significant effect near the wafer, and its contribution to the magnetic field at the wafer may be comparable to that produced by the nested magnetron part, which is typically in range of 1 to 2 gauss. A quantification of this relationship is that the maximum vertical magnetic field produced by the nested magnetron at the wafer has a value within a factor of two of the value of the maximum vertical magnetic field produced by the vertically magnetized auxiliary magnet.

Figure 13:
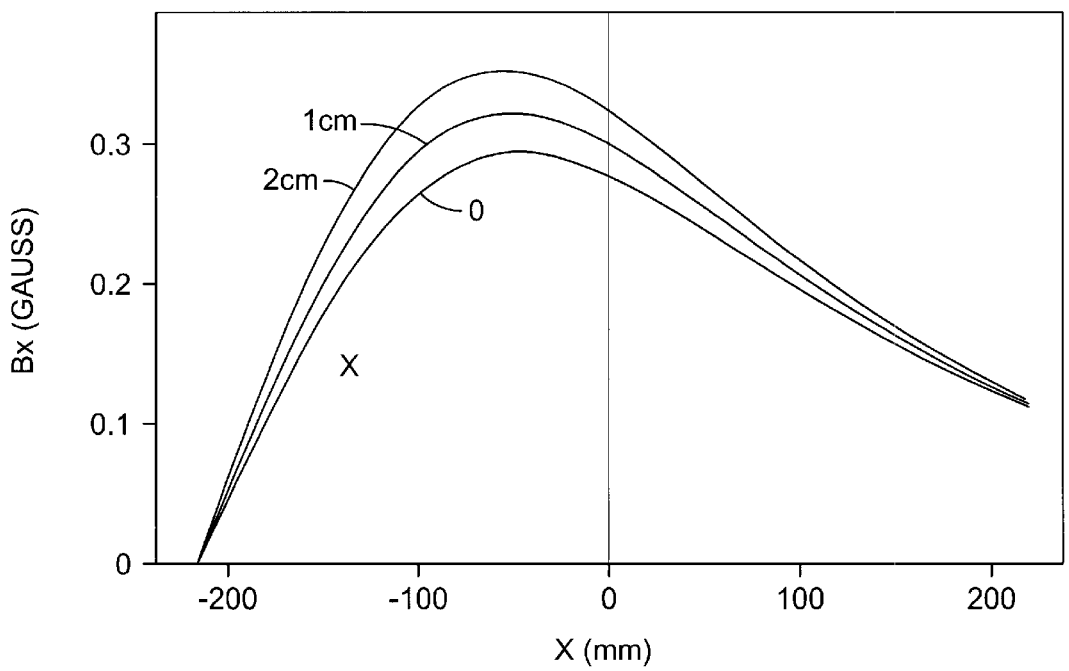
FIGS. 13 and 14 are graphs of the magnetic field near the wafer produced by the externally vertically magnetized auxiliary magnet.
Figure 14:
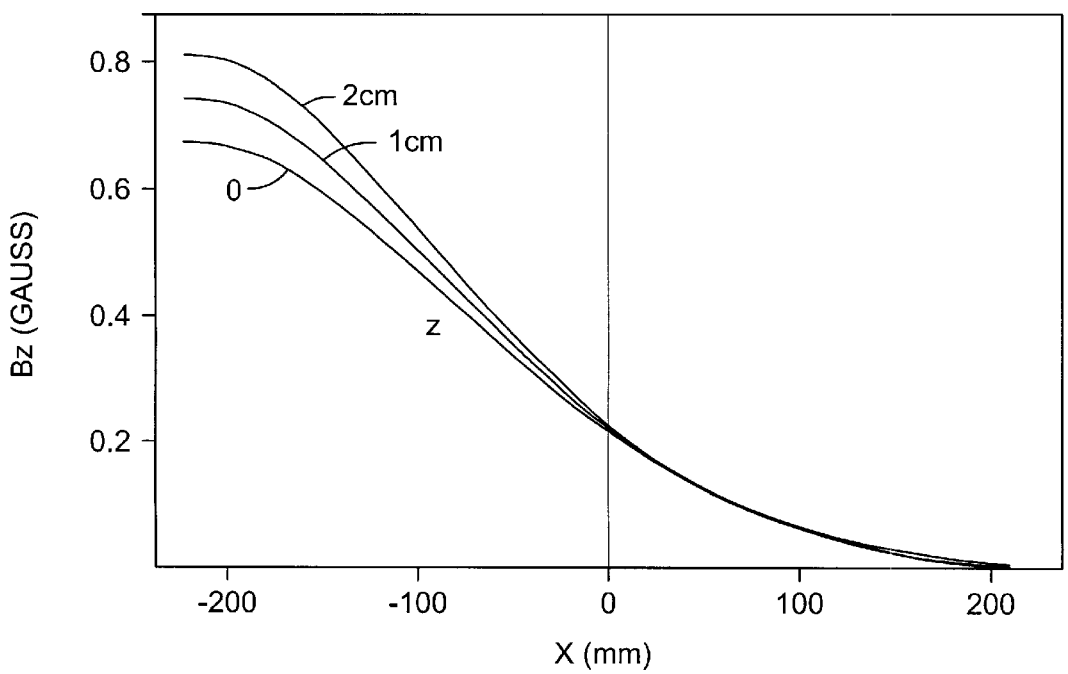

The x-component $B_x$ of the magnetic field produced by the vertically magnetized auxiliary magnet is plotted in FIG. 13 and they-component $B_y$ is plotted in FIG. 14 at three vertical distances above the wafer of 0, 1 cm, and 2 cm. It is seen that the contribution from the vertically magnetized auxiliary magnet is strongly vertical near the wafer surface and that the vertical component is strongest on the side of the wafer opposite the nested magnetron. The polarity of the vertical auxiliary magnetic field matches that from the nested magnetron in this region, while the intensity of the vertical contribution from the nested magnetron favors the side of the wafer opposite that favored by the auxiliary magnet. Accordingly, it is possible to obtain an approximately constant vertical magnetic field across the wafer by balancing the magnetic intensities of the nested magnetron and the auxiliary vertical magnet. Furthermore, tailoring the magnetic field near the wafer by adjusting the intensity and location of the auxiliary magnet can be done with very little effect on the magnetic field affecting the target sputtering.

It is thus seen that the horizontally magnetized auxiliary magnet of FIGS. 2 and 3 operates distinctly differently than does the vertically magnetized auxiliary magnet of FIGS. 9 and 10. The former is most directly used to make a more uniform sputtering erosion path in the target; the latter is most directly used to produce a more uniform vertical magnetic field adjacent the wafer, thus promoting sputtering deposition uniformity. Both may be used to improve uniformity of deposition. It is also noted that both types of auxiliary magnets may be included in a single magnetron, one auxiliary magnet being horizontally magnetized and included between the poles of the nested magnetron, the other auxiliary magnet being vertically magnetized and located on the other side of the rotation axis from the nested magnetron.

Such auxiliary magnets thus provide more design variables that can be optimized to obtain a more uniform sputter deposition.

What is claimed is:

1. A sputtering magnetron, comprising:
   a nested unbalanced magnetron positionable at a back of a sputtering target, rotatable about a center axis of said target, and comprising an outer magnetic pole of a first magnetic polarity parallel to said center axis and surrounding an inner magnetic pole of an opposite second magnetic polarity, a total magnetic flux of said outer magnetic pole being at least 150% of a total magnetic flux of said inner magnetic pole; and
   an auxiliary permanent magnet magnetized along said center axis with said first magnetic polarity, positioned on an opposite side of said center axis from said inner magnetic pole, and rotatable with said nested unbalanced magnetron.

2. The magnetron of claim 1, further comprising a second auxiliary magnet magnetized perpendicular to said center axis and positioned between said inner magnetic pole and said outer magnetic pole on a side of said inner magnetic pole opposite said center axis.

3. A sputtering magnetron, comprising:
   a nested unbalanced magnetron positionable at a back of a sputtering target, rotatable about a center axis of said target, and comprising an outer magnetic pole of a first magnetic polarity along said center axis and surrounding an inner magnetic pole of an opposite, second polarity, a total magnetic flux of said outer magnetic pole being at least 150% of a total magnetic flux of said inner magnetic pole; and
   an auxiliary permanent magnet magnetized along said center axis, rotatable with said nested unbalanced magnetron, and positioned on a side of said center axis opposite said inner magnetic pole, and positioned outside of said outer magnetic pole.

4. The magnetron of claim 3, wherein said auxiliary magnet is of said first magnetic polarity.

5. A sputtering magnetron, comprising:
   a nested unbalanced magnetron positionable at a back of a sputtering target, rotatable about a center axis of said target, and comprising an outer magnetic pole including
   a plurality of first magnets of a first magnetic polarity along said center axis, and
   a pole face band magnetically coupling said first magnets and surrounding an inner magnetic pole of an opposite magnetic polarity,
       wherein a total magnetic flux of said outer magnetic pole is at least 150% of a total magnetic flux of said inner magnetic pole; and
   an auxiliary permanent magnet magnetized along said center axis, rotatable with said nested unbalanced magnetron, and positioned outside of said pole face band and on an opposite side of said center axis from said inner magnetic pole.

6. The magnetron of claim 5, wherein said auxiliary magnet is of said first magnetic polarity.

7. A magnetron configured for use in a plasma sputtering reactor having a target and a pedestal for supporting a substrate, comprising:
   a nested unbalanced magnetron positionable at a back of said target and rotatable about a center axis of said target and comprising an inner magnetic pole of a first magnetic polarity producing a first total magnetic flux and an outer pole of an opposed second magnetic polarity surrounding said inner magnetic pole and producing a second total magnetic flux; and
   an auxiliary permanent magnet magnetized parallel to said center axis and rotatable with said nested unbalanced magnetron and positioned outside of said outer magnetic pole and on an opposite side of said center axis from said inner magnetic pole.

8. The magnetron of claim 7, wherein a value of a maximum vertical magnetic field produced by said nested unbalanced magnetron at a surface of said pedestal is within a factor of two of a value of a maximum vertical magnetic field produced by said auxiliary magnet at said surface of said pedestal.

9. The magnetron of claim 8, wherein a ratio of said second total magnetic flux to said first total magnetic flux is at least 1.5.

10. The magnetron of claim 1, further comprising a second auxiliary permanent magnet magnetized perpendicularly to said center axis and disposed between said inner and outer magnetic poles.

11. The magnetron of claim 3, wherein said nested unbalanced magnetron has a triangular shape.

12. The magnetron of claim 3, further comprising a second auxiliary permanent magnet magnetized perpendicularly to said center axis and disposed between said inner and outer magnetic poles.

13. The magnetron of claim 5, wherein said nested unbalanced magnetron has a triangular shape.

14. The magnetron of claim 5, further comprising a second auxiliary permanent magnet magnetized perpendicularly to said center axis and disposed between said inner and outer magnetic poles.

15. The magnetron of claim 7, wherein said nested unbalanced magnetron has a triangular shape.

16. The magnetron of claim 1, wherein said nested unbalanced magnetron has a triangular shape.

* * * * *